United States Patent [19]
Takeyama

[11] Patent Number: 6,128,383
[45] Date of Patent: Oct. 3, 2000

[54] INPUT/OUTPUT CIRCUIT FOR A COMMUNICATION DEVICE

[75] Inventor: Kouji Takeyama, Nagoya, Japan

[73] Assignee: Brother Kogyo Kabushiki Kaisha, Nagoya, Japan

[21] Appl. No.: 08/767,299

[22] Filed: Dec. 16, 1996

[30] Foreign Application Priority Data

Dec. 15, 1995 [JP] Japan ................................... 7-326623

[51] Int. Cl.[7] .................................................. H04M 1/00
[52] U.S. Cl. .......................... 379/387; 379/390; 379/395; 381/104
[58] Field of Search .................................... 379/395, 387, 379/399, 413, 398, 338, 344, 402, 403, 388, 389, 390; 330/250, 278, 282, 277; 381/104, 107

[56] References Cited

U.S. PATENT DOCUMENTS

| 4,146,753 | 3/1979 | D'Arrigo et al. | 379/395 |
| 4,233,474 | 11/1980 | Hishinuma et al. | 379/395 |
| 4,536,888 | 8/1985 | Wilson | 379/395 |
| 4,718,083 | 1/1988 | Boeckmann | 379/395 |
| 4,910,768 | 3/1990 | Sues et al. | 379/394 |
| 4,918,725 | 4/1990 | Takahashi | 379/394 |
| 5,133,007 | 7/1992 | Nishimura | 379/392 |
| 5,410,594 | 4/1995 | Maruyama | 379/413 |
| 5,555,300 | 9/1996 | Gutzmer | 379/406 |

Primary Examiner—Forester W. Isen
Assistant Examiner—Jacques Saint-Surin
Attorney, Agent, or Firm—Oliff & Berridge, PLC

[57] ABSTRACT

In an input/output circuit of a communication device, such as network control unit of a facsimile machine or transmission/reception circuit of a telephone set, an amplification factor of an amplifier circuit is changed without replacing the circuit components. The amplifier circuit includes operational amplifiers which amplify an input signal from a telephone line and/or an output signal sent to the telephone line. A central processing unit is provided in conjunction with the amplifiers, which outputs a control signal to the amplification circuit so that the amplification factor of the operation amplifier is changed responsive to the control signal.

10 Claims, 2 Drawing Sheets

Prior Art

INPUT/OUTPUT CIRCUIT FOR A COMMUNICATION DEVICE

BACKGROUND OF THE INVENTION

1. Field of the Invention

The present invention relates to an input/output circuit for a communication device, such as a network control unit (NCU) of a facsimile machine, a message reception/transmission circuit of a telephone set.

2. Description of the Related Art

Input/output circuits used in a communication devices, such as a facsimile machine, a telephone set, are provided with a number of amplification circuits for amplifying input signals received through a communication line and/or output signals sent out to the communication line. Due to the fact that the standards of the communication devices are not the same depending on a place (the term "place" encompasses a country, state, territory or local area in the same country, same state, same territory), it has been required to adjust an amplification factor of each amplifier circuit provided in the communication device.

To this end, the input/output circuit of the communication device includes a plurality of negative feedback amplifiers. As shown in FIG. 3, the negative feedback amplifier is typically configured by an operational amplifier OP31, and resistors R31, R32 and R33. To change the amplification factor of this amplifier, the resistance values of the resistors R31 and R32 are changed. The resistor R31 is a feedback resistor connected across the inverting input terminal and the output terminal of the operational amplifier OP31. The resistor R32 is an input resistor connected to the negative input terminal of the operational amplifier OP31. To the non-inverting input of the operational amplifier, a reference voltage REF is applied through the resistor R33.

SUMMARY OF THE INVENTION

The present invention has been made in view of the fact that adjusting amplification factors to meet various standards is complicated and troublesome. Accordingly, it is an object of the present invention to provide an input/output circuit of a communication device which complies with various standards without need for adjusting the circuit components of a negative feedback circuit.

To achieve the above and other objects, there is provided an input/output circuit in a communication device. The circuit includes amplifying means and control means, and is communicable with a remote communication device connected with a communication line. The amplifying means amplifies at least one of an incoming signal transmitted from the remote communication device and an outgoing signal sent out to the remote communication device. The control means produces a control signal according to a control program and applies the control signal to the amplifying means to change the amplification factor of the amplifying means.

The control means controls the amplification factor of the amplifying means to a predetermined fixed value.

There is further provided a current detector for detecting a current flowing in the communication line. The current detector outputs a detection signal corresponding to the current thus detected. The control means controls the amplification factor of the amplifying means in response to the detection signal output from the current detector.

More specifically, the current detector outputs the detection signal to the control means. The detection signal has a voltage level corresponding to the current detected by the current detector.

The amplifying means includes a negative feedback amplifier having a feedback ratio, and the control means changes the feedback ratio.

The negative feedback amplifier includes an operational amplifier having an inverting input terminal, a non-inverting input terminal, and an output terminal; and a feedback circuit connected between the output terminal of the operational amplifier and the inverting input terminal of the operational amplifier. The feedback circuit includes an impedance element formed by a source-to-drain path of an FET having a source, a drain and a gate. The control means controls a voltage applied to the gate of the FET to change an impedance between the source and the drain of the FET.

In the preferred embodiment of the invention, the amplifying means includes a first negative feedback amplifier and a second negative feedback amplifier. The first negative feedback amplifier amplifies the incoming signal transmitted from the remote communication device. The first negative feedback amplifier has a first feedback ratio. Similarly, the second negative feedback amplifier amplifies the outgoing signal sent out to the remote communication device. The second negative feedback amplifier has a second feedback ratio. The control means changes the first feedback ratio and the second feedback ratio.

More specifically, the first negative feedback amplifier includes a first operational amplifier having an inverting input terminal, a non-inverting input terminal, and an output terminal; and a first feedback circuit connected between the output terminal of the first operational amplifier and the inverting input terminal of the first operational amplifier. The first feedback circuit includes a first impedance element formed by a source-to-drain path of a first FET. The second negative feedback amplifier includes a second operational amplifier having an inverting input terminal, a non-inverting input terminal, and an output terminal; and a second feedback circuit connected between the output terminal of the second operational amplifier and the inverting input terminal of the second operational amplifier. The second feedback circuit includes a second impedance element formed by a source-to-drain path of a second FET having a source, a drain and a gate. The control means controls a voltage applied to the gate of the first FET to change an impedance between the source and the drain of the first FET, and also controls a voltage applied to the gate of the second FET to change an impedance between the source and the drain of the second FET.

The communication device is connected to the remote communication device via a switchboard. The detection signal is indicative of a transmission loss depending on a distance between the communication device and the switchboard. The control means increases the levels of the amplified outgoing signal and the amplified incoming signal when the detection signal indicates that the transmission loss is larger than a predetermined value.

BRIEF DESCRIPTION OF THE DRAWINGS

The above and other objects, features and advantages of the present invention will become more apparent from the following description when taken in conjunction with the accompanying drawings, in which.

DETAILED DESCRIPTION OF THE PREFERRED EMBODIMENTS

Figure 1:
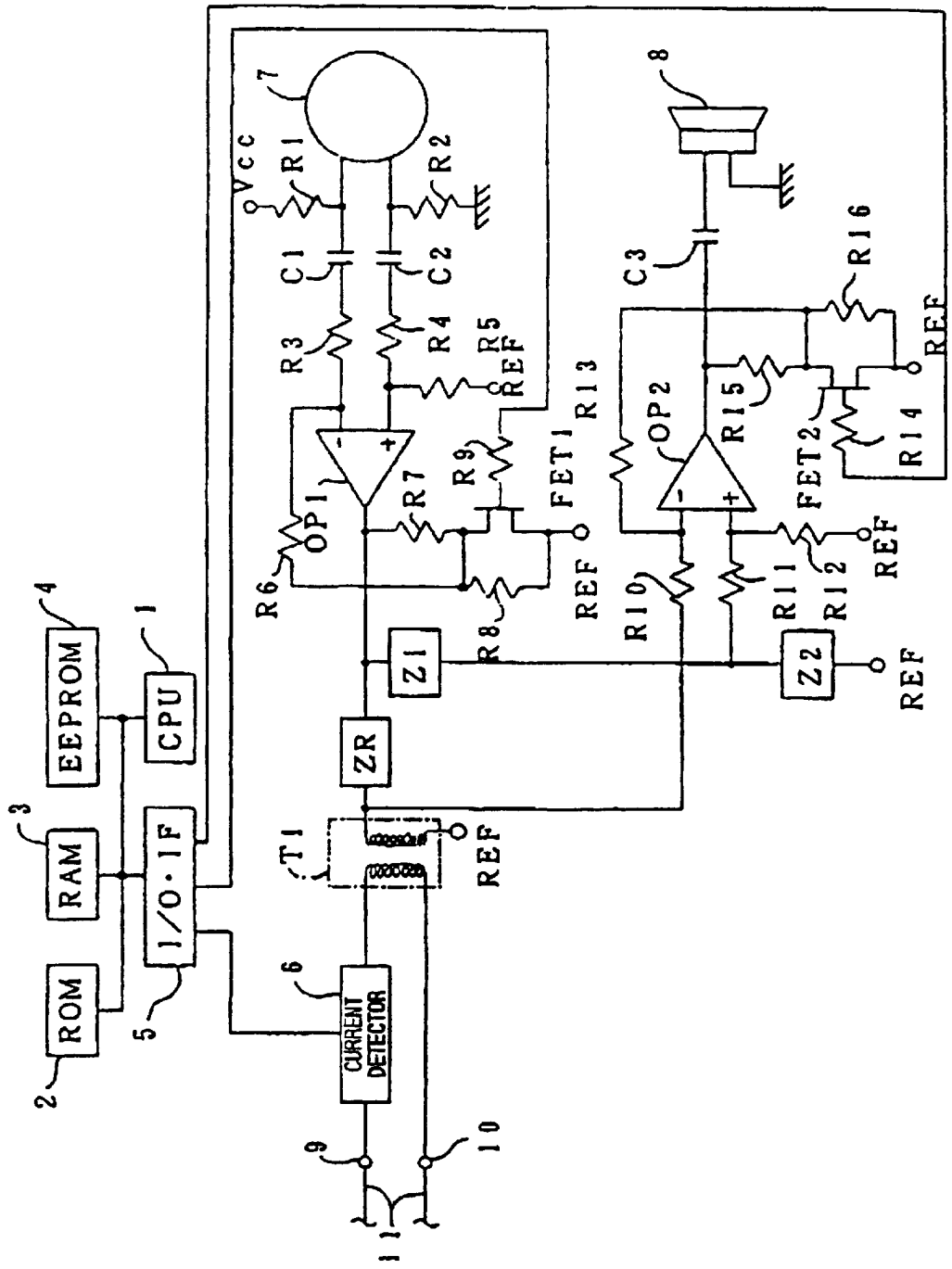
FIG. 1 is a circuit diagram showing an input/output circuit of a communication device according to the present invention.

A preferred embodiment of the present invention will be described with reference to FIGS. 1 and 2. FIG. 1 is a circuit diagram showing a message reception/transmission circuit of a telephone set.

The message reception/transmission circuit includes a central processing unit (CPU) 1, a read-only memory (ROM) 2, a random access memory (RAM) 3, an electrically erasable and programmable read-only memory (EEPROM) 4, an input/output interface (I/O.IF) 5, a current detector 6, a microphone 7, a speaker 8, an input/output terminals 9, 10, operational amplifiers OP1, OP2, field effect transistors FET1, FET2, transformer T1, impedance elements Z1, Z2, ZR, resistors R1 through R16, and capacitors C1 through C3. The CPU 1, ROM 2, RAM 3, EEPROM 4 and I/O.IF5 are mutually connected via a bus.

The CPU 1 governs the telephone set in its entirety. The CPU operates in accordance with control programs stored in the ROM 2 and outputs control signals to the gates of the FETs 1 and 2. The ROM 2 stores various programs including the control programs. The RAM 3 temporarily store data. The EEPROM 4 stores various flags and registration data. The I/P.IF5 is an input/output interface of the CPU 1. The current detector 6 detects a line current and converts the detected current level into a voltage. The microphone 7 converts voice of a caller to an audio signal. The speaker 8 reproduces an audio signal to voice. The microphone 7 and the speaker 8 are mounted on a handset. A telephone line 11 is connected to the input/output terminals 9, 10.

The input/output terminal 9 is connected to one terminal of the primary winding of the transformer T1 via the current detector 6. Another input/output terminal 10 is connected to the other terminal of the primary winding of the transformer T1. The output of the current detector 6 is connected to the I/O.IF 5. The secondary winding of the transformer T1 has one terminal to which a reference voltage is applied and another terminal connected to one terminal of the impedance element ZR and also to one terminal of the resistor R10. The other terminal of the impedance element ZR is connected to the output terminal of the operational amplifier OP1 in a transmission side, one terminal of the impedance element Z1, and one terminal of the resistor R7. The other terminal of the resistor R7 is connected to the drain of the FET 1, one terminal of the resistor R6, and one terminal of the resistor R8. The reference voltage REF is applied to the other terminal of the resistor R8 and the source of the FET 1. The gate of the FET 1 is connected to the I/O.IF 5 via the resistor R9. The other terminal of the resistor R6 is connected to the inverting input terminal of the operational amplifier OP1 and one terminal of the resistor R3. The other terminal of the resistor R3 is connected to one terminal of the capacitor C1. The other terminal of the capacitor C1 is connected to one terminal of the microphone 7 and one terminal of the resistor R1. The other terminal of the resistor R1 is connected to a power source Vcc. The other terminal of the microphone 7 is connected to one terminal of the resistor R2 and one terminal of the capacitor C2. The other terminal of the resistor R2 is grounded. The other terminal of the capacitor C2 is connected to one terminal of the resistor R4 whose another terminal is connected to one terminal of the resistor R5 and the non-inverting input terminal of the operational amplifier OP1. To the other terminal of the resistor R5 is applied the reference voltage REF.

The other terminal of the impedance element Z1 is connected to one terminal of the impedance element Z2 and one terminal of the resistor R11. The reference voltage is applied to the other terminal of the impedance element Z2. The other terminal of the resistor R11 is connected to the non-inverting input terminal of the operational amplifier OP2 and one terminal of the resistor R12. The reference voltage is applied to the other terminal of the resistor R12. The other terminal of the resistor R13 is connected to the drain of the FET2, one terminal of the resistor R15, and one terminal of the resistor R16. To the source of the FET 2 and the other terminal of the resistor R16 is applied the reference voltage REF. The gate of the FET 2 is connected to the I/O.IF 5 vial the resistor R14. The other terminal of the resistor R15 is connected to the output terminal of the operational amplifier OP2 and one terminal of the capacitor C3 whose another terminal is connected to one terminal of the speaker 8. The other terminal of the speaker 8 is grounded. The reference voltage REF is a half of the source voltage Vcc.

Next, operation of the transmission/reception circuit thus arranged will be described.

When the telephone link is established, the current detector 6 detects the line current on the telephone line 11 and outputs a voltage value corresponding to the detected line current to the CPU 1 via the I/O.IF 5. On the other hand, the caller's voice is converted to the audio signal by the microphone 7 and the latter signal is amplified by an amplifying means which includes the operational amplifier OP1. The amplified audio signal is sent out to the telephone line 11 via the transformer T1 and the input/output terminals 9, 10. A difference in voltage between the output voltage of the operational amplifier OP1 and the reference voltage REF is subject to a voltage division by the resistance of the resistor R7 and the composite resistance of the parallel circuit consisting of the resistor R8 and the drain-to-source of the FET 1. The divided voltage developed at the junction of the resistor R7 and the parallel circuit is fed back to the inverting input terminal of the operational amplifier OP1 via the resistor R6. Therefore, the amplification factor A1 of the amplifying means is given by the following equation:

$$A1 = \frac{Rd}{Rc} \times \left(\frac{Ra + Rb \,//\, Rds1}{Rb \,//\, Rds1}\right)$$
$$= \frac{Rd}{Rc} \times \left(1 + \frac{RaRb + RaRds1}{RbRds1}\right)$$

Figure 2:
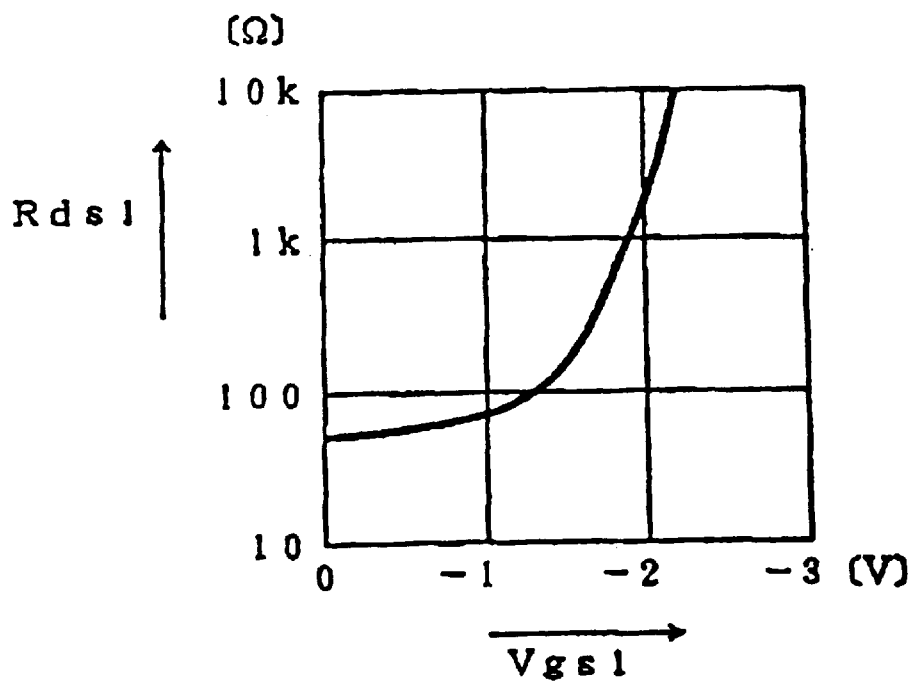
FIG. 2 is a graphical representation showing a relationship between a voltage across the gate and source of a field effect transistor and a resistance value between the drain and source.
Figure 3:
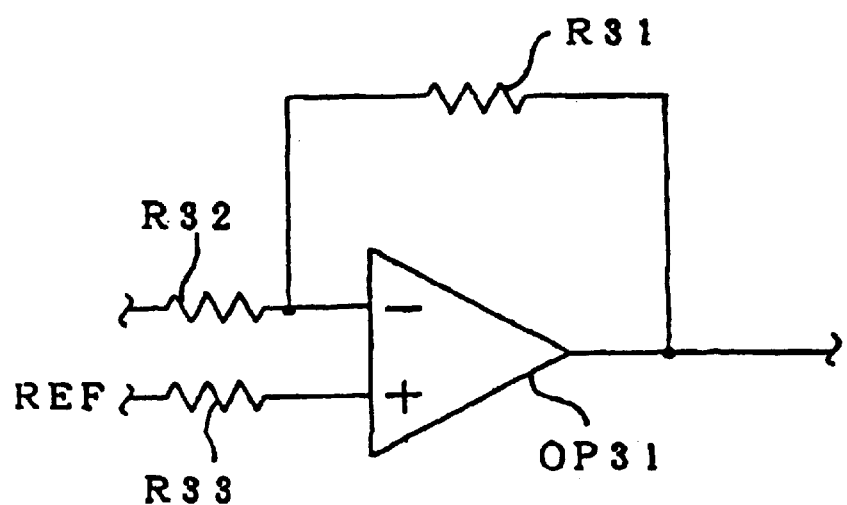
FIG. 3 is a circuit diagram showing a negative feedback circuit incorporated in an input/output circuit of a conventional communication device.

As shown in FIG. 2, the drain-to-source resistance Rds of the FET1 changes in accordance with the gate-to-source voltage Vgs1 of the FET 1. Therefore, the change of the gate-to-source voltage Vgs1 of the FET 1 changes the drain-to-source resistance Rds1 of the FET 1, so that the amplification factor A1 of the operational amplifier OP1 changes. Based on the above-described properties of the circuit, a control voltage is applied to the gate of the FET 1 from the CPI 1 via the I/O.IF 5 and the resistor R9, thereby controlling the amplification factor A1 of the operational amplifier OP1 to be a relevant value complying with the standards regulated by the state or country wherever it is used. The CPU 1 further changes the control voltage to be applied to the gate of the FET 1 depending on the voltage detected in the current detector 6. Specifically, when a switchboard is located far from the telephone set, the transmission loss in the telephone line 11 reduces the line current flowing in the telephone line 11. Therefore, the CPU 1 increases the control voltage in accordance with the line current. Consequently, the drain-to-source resistance Rds1 of the FET 1 reduces and the amplification factor A1 of the operational amplifier OP1 is increased as is apparent from the above formula. Conversely, when the switchboard is located near the telephone set, a relatively large level of line current is available as the transmission loss in the telephone line 11 is relatively small. Therefore, the CPU 1 reduces the control voltage in accordance with the line current. Consequently, the drain-to-source resistance Rds1 of the FET 1 increases as can be seen from the above formula. In this manner, the CPU 1 controls the amplification factor of the operational amplifier 1 so that an outgoing signal with a predetermined level is received at the switchboard regardless of the distance between the switchboard and the telephone set.

An incoming signal from the switchboard is applied to the non-inverting input terminal of the operational amplifier OP2 via the transformer T1 and the resistance R10, and is amplified thereby. The incoming signal thus amplified is applied to the speaker 8 and audible sound is thereby reproduced. In this mode, the amplification factor of the operational amplifier OP2 is controlled by the CPU 1 so as to be a relevant value complying with the standard in the place to be used. Furthermore, the amplification factor of the operational amplifier OP2 is controlled by the control voltage from the CPU 1 so that the audible sound with a predetermined level regulated by the standards is reproduced from the speaker regardless of the distance between the telephone set and the switchboard.

The control voltages applied to the gates of the FETs 1 and 2 are changed because that some states or countries require that the transmission loss between the switchboard and the telephone set be compensated for. For the states or countries where such a compensation is not required, it is not necessary to change the control voltages applied to the gates of the FETs 1 and 2 in accordance with the detection voltage obtained in the current detector 6. In this case, the CPU 1 is programmed to output predetermined control voltages so that the amplification factors of the operational amplifiers OP1 and OP2 comply with the standards.

As described, according to the preferred embodiment of the present invention, the amplification factors of the operational amplifiers OP1 and OP2 can be changed as desired without replacing circuit components in the input circuit of the amplifiers including the operational amplifiers OP1 and OP2 and/or the circuit components of the negative feedback circuits. That is, the circuit components, such as resistors, need not be replaced regardless of the country where the input/output circuit is used. The amplification factors of the amplifiers can be changed simply by modifying the program for executing the CPU1. This facilitates management of the circuit at the time of manufacture. The program for executing the CPU 1 is typically different on a country-by-country basis due to difference in language to be displayed on the display. However, preparation of programs for different languages does not impose a heavy burden to the manufacturer. In the manufacturing process, the control value from the CPU 1 may be adjusted so that the amplification factor becomes a desired value and the adjusted value may be stored in the EEPROM 4.

Because the current detector 6 is provided which outputs the detection signal dependent on the current value of the telephone line 11 and the CPU 1 adjusts the control voltage depending on the detection voltage from the current detector 6, a circuit can be provided which can comply with the standard requiring that the transmission loss caused by the distance between the telephone set and the switchboard be compensated for. The current detector can also be used as a sensor for sensing whether or not a current is being flowing on the telephone line 11, an increase of the manufacturing cost by the provision of the current sensor 6 is not significant. Specifically, there are devices in which a current detection circuit is provided for sensing a current flowing in the telephone line and outputting a voltage depending on the current flowing therein. For such devices, the current detector 6 can be effectively used.

Because the feedback ratio of the negative feedback circuit is varied by the CPU 1, an amplification can be accomplished stably and a precise control can be achieved. Further, adjustment of the feedback ratio can be performed easily and consumption power for implementing this control is extremely small.

For the countries not requiring that the detection voltage from the current sensor be reflected on the control voltage, the modification of the program will not be necessary.

While only one exemplary embodiment of the present invention has been described in detail, those skilled in the art will recognize that there are many possible modifications and variations which may be made in this exemplary embodiment while yet retaining many of the novel features and advantages of the invention. Accordingly, all such modifications and variations are intended to be included within the scope of the appended claims.

What is claimed is:

1. An input/output circuit in a communication device communicable with a remote communication device connected with a communication line, the circuit comprising:
    amplifying means for amplifying at least one of an incoming signal transmitted from the remote communication device and an outgoing signal sent out to the remote communication device, said amplifying means having an amplification factor and a negative feedback amplifier including a feedback ratio;
    control means for producing a control signal at a predetermined level according to a control program and applying the control signal to said amplifying means to change the amplification factor of said amplifying means to a predetermined standard; and
    wherein said negative feedback amplifier includes:
        an operational amplifier having an inverting input terminal, a non-inverting input terminal, and an output terminal; and
        a feedback circuit connected between the output terminal of said operational amplifier and the inverting input terminal of said operational amplifier, and including an impedance element formed by a source-to-drain path of an FET having a source, a drain and a gate;
        wherein said control means controls a voltage applied to the gate of said FET to change an impedance between the source and the drain of said FET.

2. The input/output circuit according to claim 1, further comprising a current detector for detecting a current flowing in the communication line and outputting a detection signal corresponding to the current thus detected, and wherein said control means controls the amplification factor of said amplifying means in response to the detection signal output from said current detector.

3. The input/output circuit according to claim 2, wherein said current detector outputs the detection signal to said control means, the detection signal having a voltage level corresponding to the current detected by said current detector.

4. The input/output circuit according to claim 1, said amplifying means comprises a first negative feedback amplifier for amplifying the incoming signal transmitted from the remote communication device, said first negative feedback amplifier having a first feedback ratio, and a second negative feedback amplifier for amplifying the outgoing signal sent out to the remote communication device, said second negative feedback amplifier having a second feedback ratio, and wherein said control means changes the first feedback ratio and the second feedback ratio.

5. The input/output circuit according to claim 4, wherein said first negative feedback amplifier comprises:
  a first operational amplifier having an inverting input terminal, a non-inverting input terminal, and an output terminal; and
  a first feedback circuit connected between the output terminal of said first operational amplifier and the inverting input terminal of said first operational amplifier, and including a first impedance element formed by a source-to-drain path of a first FET having a source, a drain and a gate,
wherein said second negative feedback amplifier comprises:
  a second operational amplifier having an inverting input terminal, a non-inverting input terminal, and an output terminal; and
  a second feedback circuit connected between the output terminal of said second operational amplifier and the inverting input terminal of said second operational amplifier, and including a second impedance element formed by a source-to-drain path of a second FET having a source, a drain and a gate, and
wherein said control means controls a voltage applied to the gate of said first FET to change an impedance between the source and the drain of said first FET, and also controls a voltage applied to the gate of said second FET to change an impedance between the source and the drain of said second FET.

6. An input/output circuit in a communication device communicable with a remote communication device connected with a communication line, said circuit comprising:
  a transmission section connected to the remote communication device through the communication line, said transmission section including input means for inputting outgoing information and outputting an outgoing signal indicative of the outgoing information, a first amplifier including a first negative feedback amplifier having a first feedback ratio, said first amplifier being connected to said input means to receive the outgoing signal and outputting an amplified outgoing signal to the communication line;
  a reception section connected to the remote communication device through the communication line, said reception section including a second amplifier including a second negative feedback amplifier having a second feedback ratio, said second amplifier being connected to said remote communication device through the communication line for receiving an incoming signal from the remote communication device and outputting an amplified incoming signal, and output means connected to said second amplifier to receive the amplified incoming signal and outputting incoming information contained in the amplified incoming signal;
  a current detector for detecting a current flowing in the communication line and outputting a detection signal corresponding to the current thus detected, the detection signal having a voltage level corresponding to the current detected by said current detector;
  control means for producing a control signal according to a control program, wherein said control means controls said first amplifier and said second amplifier to change levels of the amplified outgoing signal and the amplified incoming signal in response to the detection signal, and wherein said control means changes the first feedback ratio and the second feedback ratio;
  wherein said first negative feedback amplifier comprises:
    a first operational amplifier having an inverting input terminal, a non-inverting input terminal, and an output terminal; and
    a first feedback circuit connected between the output terminal of said first operational amplifier and the inverting input terminal of said first operational amplifier, and including a first impedance element formed by a source-to-drain path of a first FET having a source, a drain and a gate,
  wherein said second negative feedback amplifier comprises:
    a second operational amplifier having an inverting input terminal, a non-inverting input terminal, and an output terminal; and
    a second feedback circuit connected between the output terminal of said second operational amplifier and the inverting input terminal of said second operational amplifier, and including a second impedance element formed by a source-to-drain path of a second FET having a source, a drain and a gate, and
  wherein said control means controls a voltage applied to the gate of said first FET to change an impedance between the source and the drain of the first FET, and also controls a voltage applied to the gate of the second FET to change an impedance between the source and the drain of said second FET.

7. The input/output circuit according to claim 6, wherein said input means comprises a microphone, and said output means comprises a speaker.

8. The input/output circuit according to claim 6, wherein said communication device is connected to said remote communication device via a switchboard, and wherein said detection signal is indicative of a transmission loss depending on a distance between the communication device and said switchboard.

9. The input/output circuit according to claim 8, wherein said control means increases the levels of the amplified outgoing signal and the amplified incoming signal when said detection signal indicates that the transmission loss is larger than a predetermined value.

10. An input/output circuit in a communication device communicable with a remote communication device connected with a communication line, the circuit comprising:
  amplifying means for amplifying at least one of an incoming signal transmitted from the remote communication device and an outgoing signal sent out to the remote communication device, said amplifying means having an amplification factor and a first negative feedback amplifier for amplifying the incoming signal transmitted from the remote communication device, said first negative feedback amplifier having a first feedback ratio, and a second negative feedback amplifier for amplifying the outgoing signal sent out to the remote communication device, said second negative feedback amplifier having a second feedback ratio;
  control means for producing a control signal at a predetermined level according to a control program and applying the control signal to said amplifying means to change the amplification factor of said amplifying means to a predetermined standard, and wherein said control means changes the first feedback ratio and the second feedback ratio;

wherein said first negative feedback amplifier comprises:
a first operational amplifier having an inverting input terminal, a non-inverting input terminal, and an output terminal; and
a first feedback circuit connected between the output terminal of said first operational amplifier and the inverting input terminal of said first operational amplifier, and including a first impedance element formed by a source-to-drain path of a first FET having a source, a drain and a gate, wherein said second negative feedback amplifier comprises:
a second operational amplifier having an inverting input terminal, a non-inverting input terminal, and an output terminal; and
a second feedback circuit connected between the output terminal of said second operational amplifier and the inverting input terminal of said second operational amplifier, and including a second impedance element formed by a source-to-drain path of a second FET having a source, a drain and a gate; and wherein said control means controls a voltage applied to the gate of said first FET to change an impedance between the source and the drain of said first FET, and also controls a voltage applied to the gate of said second FET to change an impedance between the source and the drain of said second FET.

* * * * *